(12) United States Patent
Kim (10) Patent No.: US 9,837,148 B2
(45) Date of Patent: Dec. 5, 2017

(54) METHOD FOR FABRICATING SEMICONDUCTOR DEVICE AND METHOD FOR OPERATING THE SAME

(71) Applicant: SK hynix Inc., Icheon (KR)

(72) Inventor: Kyung-Wan Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/163,596

(22) Filed: May 24, 2016

(65) Prior Publication Data

US 2017/0186948 A1 Jun. 29, 2017

(30) Foreign Application Priority Data

Dec. 29, 2015 (KR) .................. 10-2015-0188644

(51) Int. Cl.
*G11C 13/00* (2006.01)
*H01L 45/00* (2006.01)

(52) U.S. Cl.
CPC ........ *G11C 13/004* (2013.01); *G11C 13/0069* (2013.01); *G11C 13/0097* (2013.01); *H01L 45/08* (2013.01); *H01L 45/1233* (2013.01); *H01L 45/146* (2013.01); *H01L 45/1641* (2013.01)

(58) Field of Classification Search
None
See application file for complete search history.

(56) References Cited

U.S. PATENT DOCUMENTS

| 9,025,360 | B2 | 5/2015 | Pramanik et al. | |
|---|---|---|---|---|
| 9,472,274 | B1* | 10/2016 | Lung | G11C 13/0033 |
| 2008/0253167 | A1* | 10/2008 | Symanczyk | G11C 11/39 365/148 |
| 2012/0217461 | A1* | 8/2012 | Kobayashi | H01L 45/08 257/2 |
| 2013/0295745 | A1* | 11/2013 | Takahashi | H01L 45/04 438/382 |
| 2014/0021429 | A1* | 1/2014 | Ito | H01L 45/145 257/2 |
| 2014/0175363 | A1* | 6/2014 | Tendulkar | H01L 45/08 257/4 |
| 2014/0299832 | A1* | 10/2014 | Jameson | H01L 45/1253 257/4 |

* cited by examiner

*Primary Examiner* — Douglas King (57) ABSTRACT

A method for fabricating a semiconductor device and a method for operating the semiconductor device are provided. The method for fabricating a semiconductor device includes forming a first electrode layer; forming a material layer, including conductive path components, over the first electrode layer; forming a second electrode layer over the material layer; performing a forming operation, which includes initially creating, in the material layer, a conductive path that electrically connects the first electrode layer to the second electrode layer by applying one of a predetermined voltage and a predetermined current between the first and second electrode layers, the conductive path including the conductive path components; and performing a first heat-treatment process at a predetermined temperature that removes some of the conductive path components from the conductive path, wherein a resistance state of the material layer changes based on the creation or dissolution of the conductive paths.

14 Claims, 8 Drawing Sheets

METHOD FOR FABRICATING SEMICONDUCTOR DEVICE AND METHOD FOR OPERATING THE SAME

CROSS-REFERENCE TO RELATED APPLICATIONS

The present application claims priority of Korean Patent Application No. 10-2015-0188644, entitled "METHOD FOR FABRICATING SEMICONDUCTOR DEVICE AND METHOD FOR OPERATING THE SAME" and filed on Dec. 29, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the operating characteristics and reliability of a semiconductor device be improved.

In an implementation, a method for fabricating a semiconductor device may include: forming a first electrode layer; forming a material layer, including conductive path components, over the first electrode layer; forming a second electrode layer over the material layer; performing a forming operation, which includes initially creating, in the material layer, a conductive path that electrically connects the first electrode layer to the second electrode layer by applying one of a predetermined voltage and a predetermined current between the first and second electrode layers, the conductive path including the conductive path components; and performing a first heat-treatment process at a predetermined temperature that removes some of the conductive path components from the conductive path, wherein a resistance state of the material layer changes based on the creation or dissolution of the conductive path.

Implementations of the above method may include one or more the following.

The material layer comprises a metal oxide and the conductive path components comprise oxygen vacancies. The metal oxide includes a stoichiometrically deficient amount of oxygen. The first heat-treatment process is performed at a temperature ranging from about 300° C. to about 400° C. for multiple tens of minutes to multiple hours. The method further comprising: performing, after the second electrode layer is formed and before the forming operation is performed, a second heat-treatment process at a temperature that removes some of the conductive path components from the material layer. The material layer comprises a metal oxide and the conductive path components comprise oxygen vacancies. The metal oxide has a stoichiometrically deficient amount of oxygen. The second heat-treatment process is performed at a temperature ranging from about 300° C. to about 400° C. for multiple tens of minutes to multiple hours.

In another implementation, a method for fabricating a semiconductor device may include: forming a first electrode layer; forming a material layer, including conductive path components, over the first electrode layer; forming a second electrode layer over the material layer; performing a heat-treatment process on the material layer at a temperature that removes some of the conductive path components from the material layer; and performing a forming operation, which includes initially creating, in the material layer, a conductive path that electrically connects the first electrode layer to the second electrode layer by applying one of a predetermined voltage and a predetermined current between the first and second electrode layers, the conductive path including the remaining conductive path components, wherein a resistance state of the material layer changes based on the creation or dissolution of the conductive path.

Implementations of the above method may include one or more the following.

The material layer comprises a metal oxide and the conductive path components comprise oxygen vacancies. The metal oxide has a stoichiometrically deficient amount of oxygen. The heat-treatment process is performed at a temperature ranging from about 300° C. to about 400° C. for multiple tens of minutes to multiple hours.

In still another implementation, a method for operating a semiconductor device may include: performing a forming operation, which includes initially creating, in a material layer of the semiconductor device, a conductive path that electrically connects two electrode layers with each other by applying one of a predetermined voltage and a predetermined current between the two electrode layers, wherein a heat-treatment process is performed on the material layer before or after the forming operation, wherein the material layer is disposed between the two electrode layers, and wherein a resistance state of the material layer changes based on the creation or dissolution of the conductive path.

Implementations of the above method may include one or more the following.

The heat-treatment process is performed at a temperature that removes some of the conductive path components. The material layer comprises a metal oxide, and the creation or dissolution of the conductive path is performed based on a behavior of oxygen vacancies in the metal oxide. The metal oxide has a stoichiometrically deficient amount of oxygen. The method further comprising: performing, after the forming operation and the heat treatment process are performed, a reset operation, which includes switching the semiconductor device to a high-resistance state by dissolving the conductive path; and performing, after the forming operation and the heat-treatment process are performed, a set operation, which includes switching the semiconductor device to a low-resistance state by re-creating the conductive path. The method further comprising: performing, after the forming operation and the heat-treatment process are performed, a turn-off operation, which includes switching the semiconductor device to an off-state by dissolving the conductive path; and performing, after the forming operation and the heat-treatment process are performed, a turn-on operation, which includes switching the semiconductor device to an on-state by re-creating the conductive path.

These and other aspects, implementations and associated advantages are described in greater detail in the drawings, the description and the claims.

DETAILED DESCRIPTION

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Before describing implementations of the disclosed technology, description will be made of a semiconductor device of a comparative example, a fabrication method thereof, an operating method thereof, and problems thereof.

Figure 1:
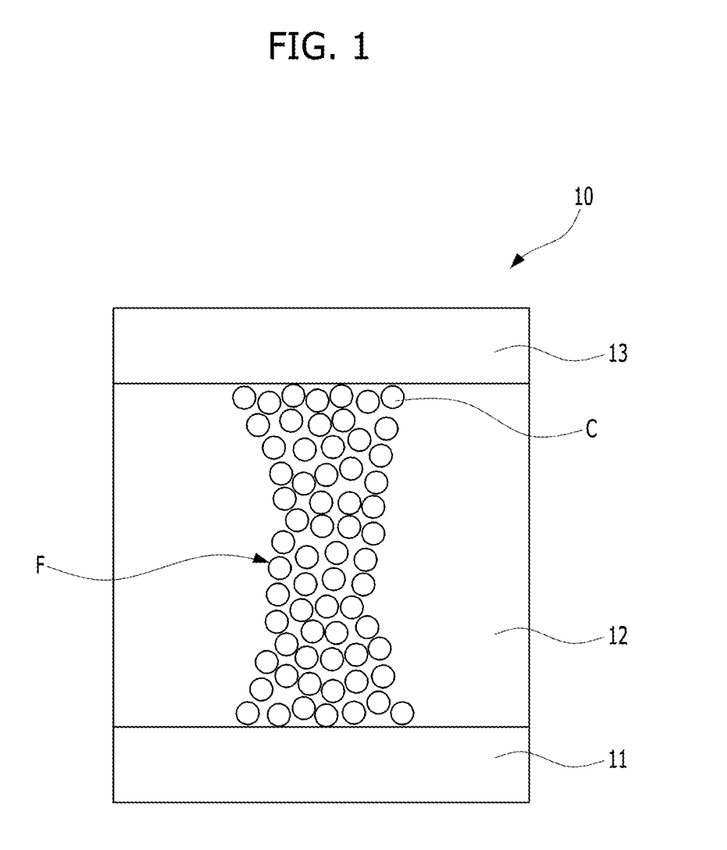
FIG. 1 is a cross-sectional view illustrating a semiconductor device according to a comparative example.
Figure 2:
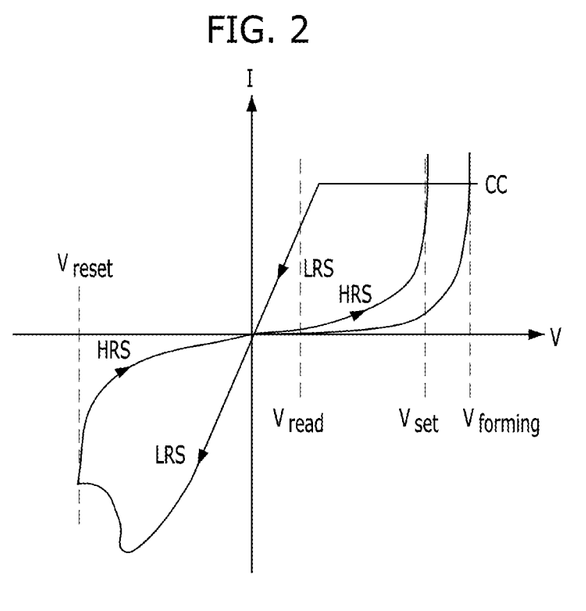
FIG. 2 is a graph illustrating a method for operating the semiconductor device of FIG. 1 when the semiconductor device is a variable resistance element.
Figure 3:
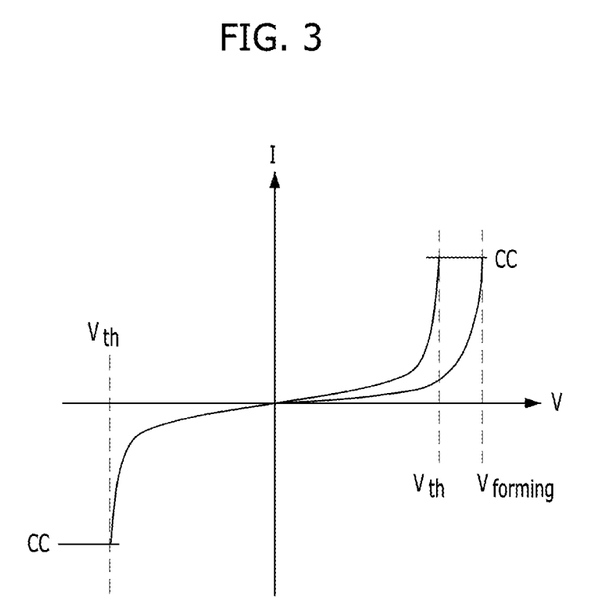
FIG. 3 is a graph illustrating a method for operating the semiconductor device of FIG. 1 when the semiconductor device is a threshold switching element.

FIG. 1 is a cross-sectional view illustrating a semiconductor device 10 according to a comparative example; FIG. 2 is a graph illustrating a method for operating the semiconductor device 10 of FIG. 1 when the semiconductor device 10 is a variable resistance element; and FIG. 3 is a graph illustrating a method for operating the semiconductor device 10 of FIG. 1 when the semiconductor device 10 is a threshold switching element.

Referring to FIG. 1, the semiconductor device 10 of the comparative example may include: a first electrode layer 11; a second electrode layer 13 disposed over the first electrode layer 11 so as to be spaced apart from the first electrode layer 11; and a material layer 12, which is disposed between the first electrode layer 11 and the second electrode layer 13 and whose resistance is changed according to whether a conductive path F in the material layer 12 is created or dissolved.

The first electrode layer 11 and the second electrode layer 13 transfer a voltage or current between two sides of the material layer 12, and may include any of various electrically conductive materials such as metals or metal nitrides.

The material layer 12 may have a variable resistance characteristic or a threshold switching characteristic according to the magnitude of the voltage or current applied between the two sides. Thus, the material layer 12 may have the resistance being changed depending on the magnitude of the voltage or current applied between its two sides.

If the material layer 12 has a variable resistance characteristic, the semiconductor device 10 can be said to be a variable resistance element. As used herein, a structure with a "variable resistance characteristic" is capable of switching between different resistance states. The current-voltage curve of the variable resistance element is illustrated in FIG. 2.

Referring to FIG. 2, the variable resistance element is initially in a high-resistance state HRS, and when a voltage applied to the variable resistance element surpasses a predetermined positive voltage, the variable resistance element undergoes a set operation, in which the resistance state of the variable resistance element changes from the high-resistance state HRS to a low-resistance state LRS. The predetermined positive voltage that causes the set operation will hereinafter be referred to as a "set voltage $V_{set}$".

The low-resistance state LRS of the variable resistance element is maintained even if the applied voltage decreases. When the applied voltage becomes lower than a predetermined negative voltage, the variable resistance element undergoes a reset operation, in which the resistance state of the variable resistance element changes from the low-resistance state LRS to the high-resistance state HRS. The predetermined negative voltage that causes the reset operation will hereinafter be referred to as a "reset voltage $V_{reset}$".

Accordingly, the variable resistance element can repeatedly switch between the high-resistance state HRS and the low-resistance state LRS. The resistance of the variable resistance element can be changed based on the creation or dissolution of the conductive path F in the material layer 12. Namely, when the conductive path F is created, the variable resistance element can switch to the low-resistance state LRS, and when the conductive path F is dissolved, the variable resistance element can switch to the high-resistance state HRS.

The initial set operation which the variable resistance element undergoes can be said to be a forming operation. A forming voltage $V_{forming}$ that causes the forming operation may be higher than the set voltage $V_{set}$ that causes subsequent set operations. This is because initially creating the conductive path F in the material layer 12 requires a higher voltage than a voltage required for creating the conductive path F in subsequent operations. After the forming operation, each of the set voltage $V_{set}$ and the reset voltage $V_{reset}$, which cause the set operation and the reset operation, respectively, can be maintained at a substantially constant level.

In any case, the variable resistance element maintains the low-resistance state LRS until the reset voltage $V_{reset}$ is applied thereto, and maintains the high-resistance state HRS until the set voltage $V_{set}$ is applied thereto. Thus, the variable resistance element can function as a nonvolatile memory element that stores different data according to its resistance state and, at the same time, maintains the stored data even when applied power is removed.

In a read operation, in which data stored in the variable resistance element is read, a read voltage $V_{read}$ between the set voltage $V_{set}$ and the reset voltage $V_{reset}$ can be applied to the variable resistance element. Because the read voltage $V_{read}$ does not set or reset the variable resistance element, the read voltage $V_{read}$ can be used to determine whether the resistance element is in either the low-resistance state LRS or the high-resistance state HRS. Accordingly, the read operation can determine which one of the set operation and the reset operation was performed on the variable resistance element immediately before the read operation.

Alternatively, if the material layer 12 has a threshold switching characteristic, the semiconductor device 10 can be said to be a threshold switching element. As used herein, the term "threshold switching characteristic" means that the material layer 12 can block or suppress a current flow when the magnitude of a voltage supplied across the first electrode layer 11 and the second electrode layer 13 is smaller than that of a predetermined threshold voltage, and can rapidly pass a current when the magnitude of the applied voltage exceeds that of the threshold voltage. The current-voltage curve of the threshold switching element is illustrated in FIG. 3.

Referring to FIG. 3, the threshold switching element can be in a high-resistance state when the magnitude of a voltage applied thereto is smaller than that of a threshold voltage $V_{th}$, and it can change to a low-resistance state when the applied voltage surpasses the threshold voltage $V_{th}$. Namely, the threshold switching element can be in a turn-on state or a turn-off state according to how the applied voltage compares to the threshold voltage $V_{th}$. The resistance of this threshold switching element can be changed based on the creation or dissolution of the conductive path F in the material layer 12. Namely, when the conductive path F is created, the threshold switching element can switch to the turn-on state, and when the conductive path F is dissolved, the threshold switching element can switch to the turn-off state.

The first operation in which the threshold switching element switches to the turn-on state or the low-resistance state can be said to be a forming operation. The magnitude of a forming voltage $V_{forming}$ that causes the forming operation may be greater than that of the threshold voltage $V_{th}$. This is because an operation for initially creating the conductive path F requires a higher voltage than a voltage required for creating the conductive path F in subsequent operations. After the forming operation, the threshold voltage $V_{th}$ can be maintained at a substantially constant level.

In any case, the term "threshold switching element" means an element that changes its resistance according to how an applied voltage compares to a threshold voltage, that is, an element that is turned on or tuned off with respect to the threshold voltage. Unlike the variable resistance element, the threshold switching element cannot maintain its resistance state when applied power is removed, and cannot have two or more possible resistance states at the same applied voltage.

The threshold switching element may be used as a selection element that is connected to the above-described variable resistance element, so as to control access to the variable resistance element. Accordingly, the variable resistance element and the threshold switching element can form a unit memory cell. Alternatively, the threshold switching element may also be used as a volatile memory element.

Referring to FIG. 1 again, whether the semiconductor device 10 functions as a variable resistance element or as a threshold switching element can be determined according to the type and/or structure of the material layer 12. For example, if the semiconductor device 10 is a variable resistance element, the material layer 12 may have a single-layer or multilayer structure including various materials that are used in RRAM, PRAM, FRAM, MRAM or the like, the materials including, for example, metal oxides such as transition metal oxides or perovskite-based materials, phase-change materials such as chalcogenide-based materials, ferroelectric materials, ferromagnetic materials, or the like. As another example, if the semiconductor device 10 is a threshold switching element, the material layer 12 may include a tunneling dielectric layer having a relatively wide bandgap. The tunneling dielectric layer may include a material serving as a diode, an ovonic threshold switching (OST) material such as a chalcogenide-based material, a mixed ionic electronic conducting (MIEC) material such as a metal-containing chalcogenide-based material, or a metal insulator transition material such as $NbO_2$ or $VO_2$, $SiO_2$, $Al_2O_3$, or the like.

However, the material layer 12 is not limited to the above list, and the material layer 12 may be made of any material in which the conductive path F can be created or dissolved. Components of the conductive path F are indicated by reference numeral "C". According to an implementation, when the material layer 12 has a single-layer or multilayer structure including a metal oxide containing a large amount of oxygen vacancies, the conductive path F can be created or dissolved based on the behavior of the oxygen vacancies. The oxygen vacancies may be the components C of the conductive path F. When the oxygen vacancies connect the first electrode 11 to the second electrode 13, it can be regarded that the conductive path F was created. On the contrary, when at least some of the oxygen vacancies between the first electrode 11 and the second electrode 13 are separated, such that a discontinuity between the oxygen vacancies exists between the first electrode 11 and the second electrode 13, it can be regarded that the conductive path F was dissolved. As used herein, the expression "metal oxide containing a large amount of oxygen vacancies" means a metal oxide having a stoichiometrically deficient amount of oxygen, such as $TaO_x$ (where x<2.5) or $TiO_y$ (where y<2).

Hereinafter, a method for fabricating the semiconductor device 10 of FIG. 1 described above and a method for operating the semiconductor device 10 will be described.

First, on a substrate (not shown) including a certain structure formed therein, the first electrode layer 11, the material layer 12, and the second electrode layer 13 may be sequentially deposited, and may then be patterned to have a desired shape. The material layer 12 may initially be in a state in which the conductive path F is not present. In other words, the components C (e.g., oxygen vacancies) of the conductive path F may be randomly distributed in the material layer 12 without connecting the first electrode layer 11 to the second electrode layer 13.

Next, a forming operation can be performed by applying a predetermined forming voltage to the first electrode layer 11 and the second electrode layer 13 to thereby create the conductive path F in the material layer 12. The conductive path F electrically connects the first electrode layer 11 to the second electrode layer 13. Thus, after the forming operation, the material layer 12 can switch to a low-resistance state or a turn-on state. The forming operation allows the semiconductor device 10 to be set to a state in which it can operate. Namely, after the conductive path F has been initially formed, subsequent operations such as, for example, set/reset operations and/or on/off operations, may be performed on the material layer 12 of the semiconductor device 10.

However, in the semiconductor device 10 of the comparative example as described above, a relatively large amount of energy is required to perform the forming operation, which may cause movement of oxygen ions or the like around the conductive path F, thereby deforming or damaging lattices around the conductive path F. When the lattices are deformed or damaged, misoperations such as an unintentional change in the resistance state of the semiconductor device 10 may occur, and thus the reliability of the semiconductor device 10 can deteriorate.

In addition, the large amount of energy that is required to perform the forming operation of the semiconductor device 10 can move more oxygen ions than are necessary for the operation of the semiconductor device 10, thus creating an unnecessarily large conductive path F or an unnecessarily large number of conductive paths F. This can cause the magnitude of a voltage or current required to perform the switching operation of the semiconductor device 10 to increase over time and an overshooting current may occur in the set operation, which switches the material layer 12 to a low-resistance state.

Additionally, a problem can arise in that an off-current of the semiconductor device 10 may increase over time, resulting in an increase in a leakage current through the semiconductor device 10 during operations. Because an increase in the off-current means a decrease in a difference between an on-current and the off-current, a data read margin may be reduced when the semiconductor device 10 is used as a memory cell. As a result, an operating characteristic of the semiconductor device 10 can deteriorate.

An implementation provides an improved method for fabricating a semiconductor device having better reliability and/or operating characteristics than the semiconductor device 10 of the comparative example, by minimizing lattice deformation or damage around each of conductive paths F and reducing the size or number of the conductive paths F that are created in a forming operation. Hereinafter, the improved method for fabricating a semiconductor device will be described in further detail with reference to FIGS. 4A and 4B.

Figure 4A:
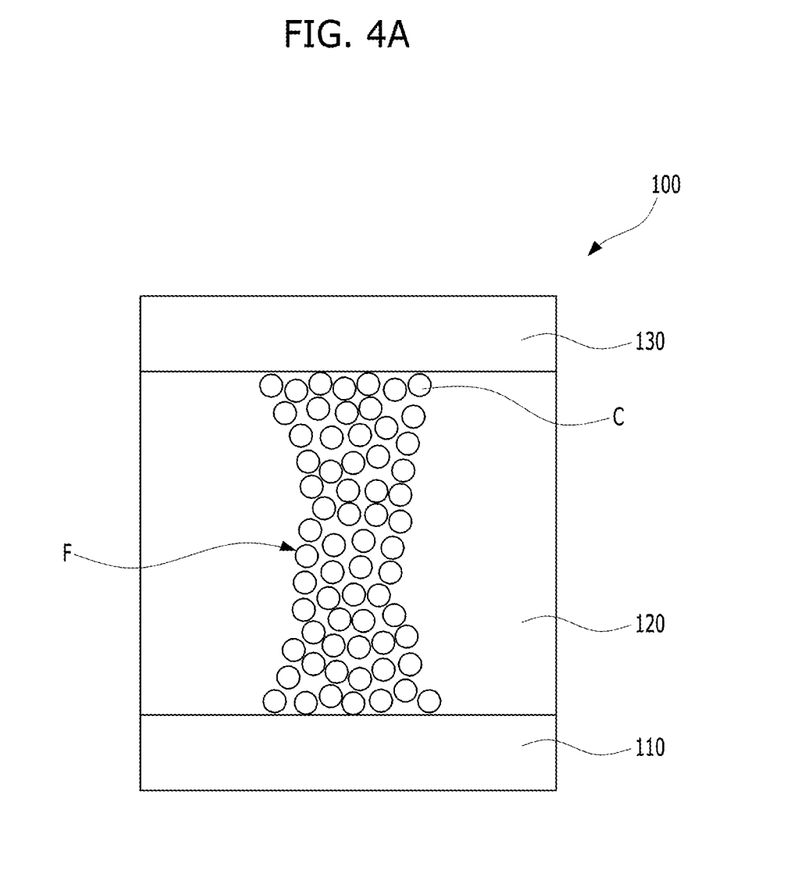
FIGS. 4A and 4B are cross-sectional views illustrating a method for fabricating a semiconductor device according to an implementation of the disclosed technology.
Figure 4B:
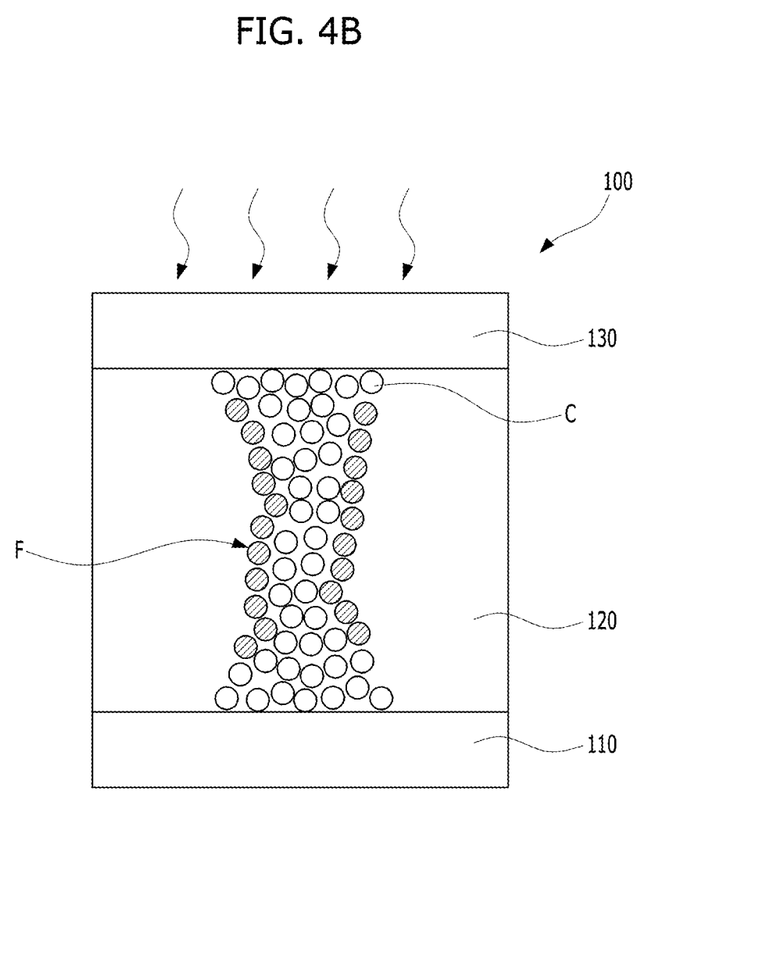

FIGS. 4A and 4B are cross-sectional views illustrating a method for fabricating a semiconductor device 100 according to an implementation of the disclosed technology. In the following description of FIGS. 4A and 4B, the detailed description of parts substantially identical to those described above with respect to the semiconductor device 10 of FIG. 1, the fabrication method thereof, and the operating method thereof will be omitted.

Referring to FIG. 4A, a first electrode layer 110, a material layer 120, and a second electrode layer 130 may be sequentially formed. Formation of the first electrode layer 110, the material layer 120, and the second electrode layer 130 can be achieved by the sequential deposition of materials comprising such layers, followed by a patterning process. If necessary, the patterning process may be omitted or may be performed after a subsequent forming operation or a heat treatment process.

Thereafter, a forming operation may be performed in which a voltage greater than or equal to a predetermined forming voltage is applied between the first electrode layer 110 and a second electrode layer 130. The applied voltage creates a conductive path F in the material layer 120 that electrically connects the first electrode layer 110 to the second electrode layer 130. The semiconductor device 100 resulting from the forming operation may be substantially the same as the semiconductor device 10 shown in FIG. 1. Namely, lattice deformation or damage around the conductive path F can occur, and the size or number of conductive paths F can be relatively large. To solve such problems, a subsequent process, as shown in FIG. 4B, may be performed.

Referring to FIG. 4B, a heat-treatment process may be performed on the semiconductor device 100 of FIG. 4A to remove some of components C of the conductive path F. In order to remove some of the components C to a suitable extent, the heat-treatment temperature and/or time may be controlled. For example, if the material layer 120 includes a metal oxide and the components C of the conductive path F are oxygen vacancies in the metal oxide, energy applied to the oxygen vacancies by the heat-treatment process may cause some of the oxygen vacancies to recombine with oxygen ions in the metal oxide. As a result, some of the oxygen vacancies can be removed from the material layer 120, as indicated by the shaded circles in FIG. 4B. The heat-treatment process, which removes some of the oxygen vacancies, may be performed at a temperature between about 300° C. and about 400° C. for multiple tens of minutes to multiple hours. When some of the oxygen vacancies are removed, the number of components C in the conductive path F can decrease, and thus the size and/or number of the conductive paths F can decrease.

Furthermore, the heat-treatment process may cure undesired lattice deformation or damage around the conductive path F.

After the heat-treatment process, the semiconductor device 100 can be operated at a suitable voltage or current. As a result, the semiconductor device 100 of this implementation can have improved reliability and operating characteristics compared to the semiconductor device 10 of the comparative example. This improvement was experimentally proved, and will be described in further detail below with reference to FIG. 6.

Meanwhile, in another implementation, a heat-treatment process may be performed before the forming operation in order to reduce the size or number of the conductive paths F. A method for fabricating a semiconductor device in accordance with the other implementation will now be described in further detail with reference to FIGS. 5A to 5C.

Figure 5A:
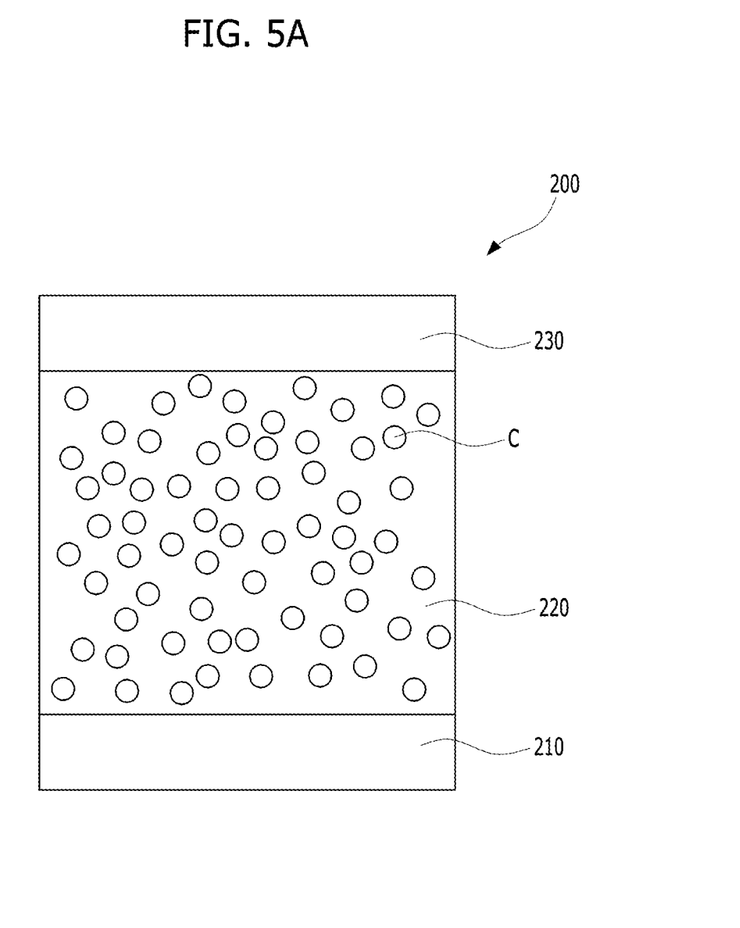
FIGS. 5A to 5C are cross-sectional views illustrating a method for fabricating a semiconductor device according to another implementation of the disclosed technology.
Figure 5B:
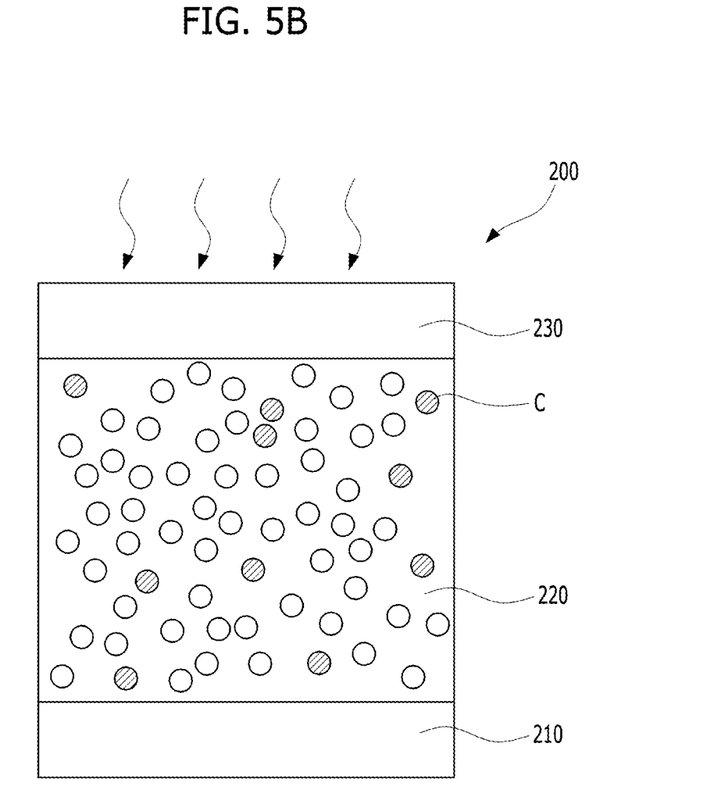
Figure 5C:
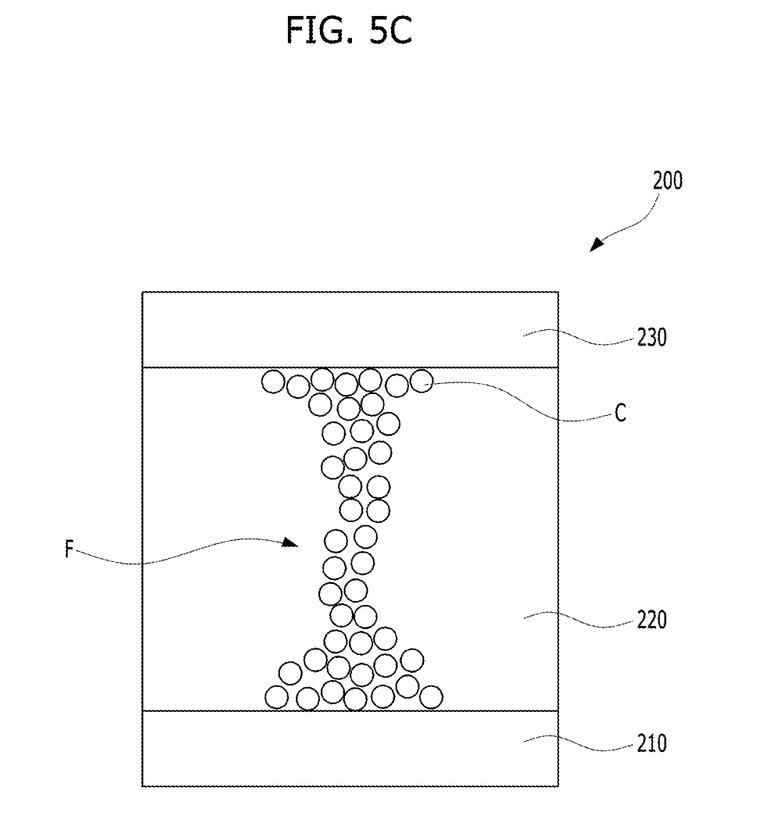

FIGS. 5A to 5C are cross-sectional views illustrating the method for fabricating the semiconductor device according to the other implementation of the disclosed technology. In the following description of FIGS. 5A to 5C, the detailed description of parts substantially identical to those described above with respect to the semiconductor device 10 of FIG. 1, the fabrication method thereof, and the operating method thereof will be omitted.

Referring to FIG. 5A, a first electrode layer 210, a material layer 220, and a second electrode layer 230 may be sequentially formed. Formation of the first electrode layer 210, the material layer 220, and the second electrode layer 230 can be achieved by sequentially depositing materials comprising such layers, followed by a patterning process. If necessary, the patterning process may be omitted or may be performed after a forming operation or heat-treatment process. The material layer 220 may initially be in a state in which a conductive path F has not yet been created therein. That is, components C (e.g., oxygen vacancies) that will form a conductive path F may be randomly distributed throughout the material layer 220.

Referring to FIG. 5B, the semiconductor device 200 shown in FIG. 5A may be subjected to the heat-treatment process to remove some of the components C. For example, if the material layer 220 includes a metal oxide and the components C are oxygen vacancies in the metal oxide, energy applied to the oxygen vacancies by a heat-treatment process may recombine some of the oxygen vacancies with oxygen ions in the metal oxide. As a result, some of the oxygen vacancies can be removed from the material layer 220, as indicated by the shaded circles in FIG. 5B.

Referring to FIG. 5C, the forming operation may be performed, in which a predetermined forming voltage is applied between the first electrode layer 210 and the second electrode layer 230 to create a conductive path F in the material layer 220. The conductive path F electrically connects the first electrode layer 210 to the second electrode layer 230. According to the implementation of FIGS. 5A through 5C, the size and/or number of conductive paths F that are formed in the forming operation can be reduced because the heat-treatment process reduces the number of components C in the material layer 220, as shown in FIG. 5B.

After the heat-treatment process, the semiconductor device 200 can be operated at a suitable voltage or current. As a result, the semiconductor device 200 of the implementation illustrated by FIGS. 5A through 5C can have improved reliability and operating characteristics compared to the semiconductor device 10 of the comparative example. This improvement was experimentally proved, and will be described in further detail below with reference to FIG. 6.

Meanwhile, although not shown in the figures, after the forming operation as shown in FIG. 5C, another heat-treatment process may additionally be performed on the semiconductor device 200 of FIG. 5C in substantially the same manner as described above with reference to FIG. 4B. The additional heat-treatment process may further reduce the number of components C in the conductive path F so that the size and/or number of the conductive paths F can further be reduced, and may further cure lattice deformation or damage around the conductive path F. After the additional heat-treatment process is performed, the semiconductor device 200 can be operated at a much suitable voltage or current.

Figure 6:
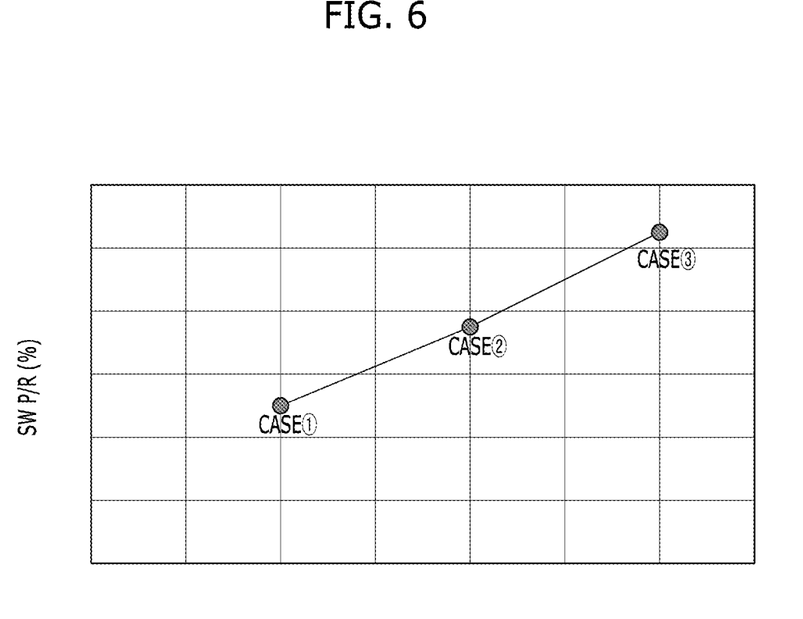
FIG. 6 is a graph comparing the operating characteristics of the semiconductor device according to the comparative example of FIG. 1, the semiconductor device according to the implementation of the disclosed technology of FIGS. 4A and 4B, and the semiconductor device according to the other implementation of the disclosed technology of FIGS. 5A to 5C.

FIG. 6 is a graph comparing the operating characteristics of the semiconductor device 10 of the comparative example depicted in FIG. 1, the semiconductor device 100 according to one implementation of the disclosed technology depicted in FIG. 4B, and the semiconductor device 200 according to another implementation of the disclosed technology depicted in FIG. 5B.

Specifically, the semiconductor device 10 of the comparative example has been subjected to a forming operation at room temperature without a heat-treatment process; the semiconductor device 100 according to one implementation of the disclosed technology has been subjected to a heat-treatment process at a temperature of about 350° C. for about 1 hour after the forming operation; and the semiconductor device 200 according to another implementation of the disclosed technology has been subjected to a heat-treatment process at a temperature of about 350° C. for about 1 hour before being subjected to the forming operation.

The y-axis of FIG. 6 represents a ratio of normally operated memory cells to tested memory cells. CASE ① represents an observed performance of a first semiconductor memory including a plurality of semiconductor devices 10 according to the comparative example as memory cells. CASE ② represents an observed performance of a second semiconductor memory including a plurality of semiconductor devices 100 according to one implementation of the disclosed technology as memory cells. CASE ③ represents an observed performance of a third semiconductor memory including a plurality of semiconductor devices 200 according to another implementation of the disclosed technology as memory cells.

Referring to CASE ① of FIG. 6, when the first semiconductor memory was operated, the ratio of normally operated memory cells to tested memory cells had a certain value.

Referring to CASE ②, when the second semiconductor memory was operated, the second semiconductor memory exhibited a higher ratio of normally operated memory cells to tested memory cells compared to CASE ①. That is, the second semiconductor memory including the plurality of semiconductor devices 100 as memory cells has a better performance than the first semiconductor memory including the plurality of semiconductor devices 10.

Furthermore, referring to CASE ③, when the third semiconductor memory was operated, the third semiconductor memory exhibited a higher ratio of normally operated memory cells to tested memory cells compared to the second semiconductor memory of CASE ②. That is, the third semiconductor memory including the plurality of semiconductor devices 200 as memory cells has a better performance than either of the first semiconductor memory including the plurality of semiconductor devices 10 as memory cells or the second semiconductor memory including the plurality of semiconductor devices 100 as memory cells.

Namely, it can be seen that the semiconductor device 200 subjected to heat treatment after the forming operation has the best operating characteristics of the tested semiconductor devices, and the semiconductor device 100 subjected to heat treatment before the forming operation has the second best operating characteristics. In any case, according to the implementations of the disclosed technology, it is possible to obtain a semiconductor device having improved operating characteristics compared to those of the semiconductor device 10 of the comparative example, which is not subjected to a heat-treatment process.

According to the implementations of the disclosed technology as described above, there may be provided a semiconductor device having improved operating characteristics and reliability.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating a semiconductor device, the method comprising:
    forming a first electrode layer;
    forming a material layer, including conductive path components, over the first electrode layer;
    forming a second electrode layer over the material layer;
    performing a forming operation, which includes initially creating, in the material layer, a conductive path that electrically connects the first electrode layer to the second electrode layer by applying one of a predetermined voltage and a predetermined current between the first and second electrode layers, the conductive path including the conductive path components; and
    performing a first heat-treatment process at a predetermined temperature that partially removes some of the conductive path components from the conductive path and that recombines the some conductive path components with oxygen ions in the material layer so that a size of the conductive path is decreased,
    wherein the first heat-treatment process is performed at a temperature ranging from about 300° C. to about 400° C. for multiple tens of minutes to multiple hours,
    wherein a resistance state of the material layer changes based on the creation or dissolution of the conductive path, and
    wherein a set operation and a reset operation are performed at room temperature after the first heat-treatment process is performed.

2. The method of claim 1, wherein the material layer comprises a metal oxide and the conductive path components comprise oxygen vacancies.

3. The method of claim 2, wherein the metal oxide includes a stoichiometrically deficient amount of oxygen.

4. The method of claim 1, further comprising:
    performing, after the second electrode layer is formed and before the forming operation is performed, a second heat-treatment process at a temperature that removes some of the conductive path components from the material layer.

5. The method of claim 4, wherein the material layer comprises a metal oxide and the conductive path components comprise oxygen vacancies.

6. The method of claim 5, wherein the metal oxide has a stoichiometrically deficient amount of oxygen.

7. The method of claim 5, wherein the second heat-treatment process is performed at a temperature ranging from about 300° C. to about 400° C. for multiple tens of minutes to multiple hours.

8. The method of claim 1, wherein the first heat-treatment process is performed after the forming operation.

9. The method of claim 1, wherein the reset operation includes dissolving the conductive path by applying a reset voltage between the first and second electrode layers, and the set operation includes recreating the conductive path by applying a set voltage between the first and second electrode layers.

10. A method for operating a semiconductor device, the method comprising:
    performing a forming operation, which includes initially creating, in a material layer of the semiconductor device, a conductive path that electrically connects two electrode layers with each other by applying one of a predetermined voltage and a predetermined current between the two electrode layers; and
    performing a set operation or a reset operation at room temperature,
    wherein a heat-treatment process is performed on the material layer after the forming operation and before the set operation and the reset operation,
    wherein the first heat-treatment process is performed at a temperature ranging from about 300° C. to about 400° C. for multiple tens of minutes to multiple hours,
    wherein the first heat-treatment process partially removes some components of the conductive path by recombining the components with oxygen ions in the material layer so that a size of the conductive path is decreased,
    wherein the material layer is disposed between the two electrode layers, and
    wherein a resistance state of the material layer changes based on the creation or dissolution of the conductive path.

11. The method of claim 10, wherein the heat-treatment process is performed at a temperature that removes some of the conductive path components.

12. The method of claim 10, wherein the material layer comprises a metal oxide, and the creation or dissolution of the conductive path is performed based on a behavior of oxygen vacancies in the metal oxide.

13. The method of claim 12, wherein the metal oxide has a stoichiometrically deficient amount of oxygen.

14. A method, comprising:
    initially creating, in a material layer of a semiconductor device, a conductive path that electrically connects two electrode layers with each other by applying a predetermined voltage or a predetermined current between the two electrode layers, the material layer being disposed between the two electrode layers, a resistance state of the material layer changing based on the creation or dissolution of the conductive path;
    performing a heat-treatment process on the material layer after the conductive path is initially created, wherein the first heat-treatment process is performed at a temperature ranging from about 300° C. to about 400° C. for multiple tens of minutes to multiple hours, the first heat-treatment process partially removing some components of the conductive path by recombining the components with oxygen ions in the material layer so that a size of the conductive path is decreased; and
    performing a reset operation or a set operation at room temperature after the heat-treatment process is performed, the reset operation including dissolving the conductive path by applying a reset voltage between the two electrode layers, the set operation including recreating conductive path through the material layer by applying a set voltage between the two electrode layers.

* * * * *